US012460314B2

(12) United States Patent
Vogel et al.

(10) Patent No.: US 12,460,314 B2
(45) Date of Patent: Nov. 4, 2025

(54) SILICON CARBIDE SUBSTRATE AND METHOD OF GROWING SIC SINGLE CRYSTAL BOULES

(71) Applicant: SICRYSTAL GMBH, Nuremberg (DE)

(72) Inventors: Michael Vogel, Nuremberg (DE); Bernhard Ecker, Nuremberg (DE); Ralf Müller, Zirndorf (DE); Matthias Stockmeier, Egloffstein (DE); Arnd-Dietrich Weber, Forchheim (DE)

(73) Assignee: SICRYSTAL GMBH, Nuremberg (DE)

( * ) Notice: Subject to any disclaimer, the term of this patent is extended or adjusted under 35 U.S.C. 154(b) by 312 days.

(21) Appl. No.: 18/172,202

(22) Filed: Feb. 21, 2023

(65) Prior Publication Data

US 2023/0193508 A1 Jun. 22, 2023

Related U.S. Application Data

(62) Division of application No. 16/492,000, filed as application No. PCT/EP2018/055627 on Mar. 7, 2018, now Pat. No. 11,624,124.

(30) Foreign Application Priority Data

Mar. 29, 2017 (EP) .................................... 17163515

(51) Int. Cl.
*C30B 23/02* (2006.01)
*C30B 29/06* (2006.01)
*C30B 29/36* (2006.01)

(52) U.S. Cl.
CPC ............ *C30B 23/025* (2013.01); *C30B 29/06* (2013.01); *C30B 29/36* (2013.01); *Y10T 428/24942* (2015.01)

(58) Field of Classification Search
CPC ....... C30B 23/00; C30B 23/025; C30B 29/06; C30B 29/36
See application file for complete search history.

(56) References Cited

U.S. PATENT DOCUMENTS 6,045,613 A 4/2000 Hunter
6,872,637 B2 3/2005 Pickering
(Continued)

FOREIGN PATENT DOCUMENTS

CN 1021297168 A 9/2011
CN 102732953 A 10/2012
(Continued)

OTHER PUBLICATIONS

English computer translation of JP-2016044081-A (Year: 2025).*
(Continued)

*Primary Examiner* — Matthew J Song
(74) *Attorney, Agent, or Firm* — Lewis Roca Rothgerber Christie LLP

(57) ABSTRACT

The present invention relates to a silicon carbide (SiC) substrate with improved mechanical and electrical characteristics. Furthermore, the invention relates to a method for producing a bulk SiC crystal in a physical vapor transport growth system. The silicon carbide substrate comprises an inner region (102) which constitutes at least 30% of a total surface area of said substrate (100), a ring shaped peripheral region (104) radially surrounding the inner region (102), wherein a mean concentration of a dopant in the inner region (102) differs by at least $1 \cdot 10^{18}$ $cm^{-3}$ from the mean concentration of this dopant in the peripheral region (104).

15 Claims, 5 Drawing Sheets

(56) References Cited

U.S. PATENT DOCUMENTS

| | | | | |
|---|---|---|---|---|
| 2002/0104478 | A1* | 8/2002 | Oguri | C30B 23/00 117/104 |
| 2006/0225645 | A1 | 10/2006 | Powell | |
| 2010/0180814 | A1 | 7/2010 | Wu | |
| 2011/0198614 | A1 | 8/2011 | Kusunoki et al. | |
| 2012/0103249 | A1 | 5/2012 | Gupta et al. | |
| 2013/0095294 | A1 | 4/2013 | Sasaki et al. | |
| 2013/0305983 | A1* | 11/2013 | Straubinger | C30B 29/36 118/726 |
| 2015/0072100 | A1 | 3/2015 | Genba et al. | |
| 2017/0323790 | A1 | 11/2017 | Ward | |
| 2021/0296443 | A1 | 9/2021 | Wada | |

FOREIGN PATENT DOCUMENTS

| | | | | | |
|---|---|---|---|---|---|
| CN | 102965733 | A | * | 3/2013 | C30B 29/36 |
| CN | 105543964 | A | * | 5/2016 | C30B 29/36 |
| DE | 10 2005 049 932 | A1 | | 4/2007 | |
| EP | 2 330 236 | A1 | | 6/2011 | |
| JP | 20062748825 | A2 | | 9/2006 | |
| JP | 2008-538542 | | | 10/2008 | |
| JP | 2009-40637 | A | | 2/2009 | |
| JP | 2010-150133 | | | 7/2010 | |
| JP | 2011201756 | A | * | 10/2011 | C30B 29/36 |
| JP | 2011-251885 | | | 12/2011 | |
| JP | 2012030994 | A | * | 2/2012 | C30B 29/36 |
| JP | 2013-100217 | | | 5/2013 | |
| JP | 2016044081 | A | * | 4/2016 | C30B 29/36 |
| WO | WO 2006/113657 | A1 | | 10/2006 | |
| WO | WO 2017/053883 | A1 | | 3/2017 | |

OTHER PUBLICATIONS

English computer translation of CN-102965733-A (Year: 2025).*

English computer translation of JP-2012030994-A (Year: 2025).*

English computer translation of JP-2011201756-A (Year: 2025).*

English computer translation of CN-105543964-A (Year: 2025).*

International Search Report corresponding to PCT/EP2018/055627, dated Apr. 20, 2018, 3 pages.

European Search Report corresponding to EP 17 16 3515, dated Jul. 21, 2017, 8 pages.

JP 2006-248825A—Machine Translation (google) (Year: 2006).

CNIPA Notification of First Office Action dated Dec. 23, 2020, issued in corresponding CN Application No. 2020121802167730, with English translation.

Japanese Office Action dated Nov. 4, 2020 issued in corresponding JP Patent Application No. 2019-551590, 7 pages, with English Translation, 8 pages.

* cited by examiner

SILICON CARBIDE SUBSTRATE AND METHOD OF GROWING SIC SINGLE CRYSTAL BOULES

CROSS-REFERENCE TO RELATED APPLICATIONS

This application is a divisional of U.S. application Ser. No. 16/492,000, filed Sep. 6, 2019, which is a U.S. National Phase Application of International Application Number PCT/EP2018/055627, filed on Mar. 7, 2018, which claims priority of European Patent Application Number 17163515.4, filed on Mar. 29, 2017, the entire contents of all of which are incorporated herein by reference.

The present invention relates to a silicon carbide (SiC) substrate with improved mechanical and electrical characteristics. Furthermore, the invention relates to a method for producing a bulk SiC crystal in a physical vapor transport growth system.

Due to its outstanding physical chemical and electrical properties silicon carbide is used inter alia as a semiconductor substrate material for power electronics semiconductor components, for radio frequency components and for a variety of special light emitting semiconductor components. Bulk SiC crystals with ideally pure and defect-free quality are required as a basis for these products.

As this is known in the art, bulk SiC crystals are generally produced by means of physical vapor deposition techniques, in particular using a sublimation method. Temperatures of more than 2000° C. are required for this process. Physical vapor transport (PVT) is essentially a sublimation and re-condensation process, in which a source material and a seed crystal are placed inside a growth furnace in such a way that the temperature of the source material is higher than that of the seed, so that the source material sublimes and the vapor species diffuse and deposit onto the seed to form single crystals.

For producing wafer-shaped substrates, the bulk SiC crystals are sliced e. g. by means of diamond impregnated wire saws. The surface is refined by subsequent multistage polishing steps. For fabricating electronic components, thin monocrystalline layers (e. g. SiC or GaN) are epitaxially deposited on the polished wafers. The characteristics of these layers and consequently of the electronic components fabricated therefrom decisively depend on the quality of the underlying SiC substrate.

In particular, the geometry of the substrate is important for the quality of the deposited epitaxial layers. For instance, an optimal thermal coupling inside an epitaxial reactor which is decisive for homogeneous and high-quality layer growth can only be ensured for substrates that do not exhibit a significant deviation from the ideal flat shape. As this is known for a person skilled in the art, bow and warp characterize the geometric characteristics of the substrate. When using substrates with unsatisfactory geometric characteristics, i. e. having too high bow and/or warp values, the subsequent epitaxial processes lead to lower quality epitaxial layers and a reduced yield of the fabrication process. U.S. Pat. No. 8,747,982 B2 shows a conventional method for fabricating SiC single crystals by means of physical vapor transport. During this process, the growth surface is defined by isothermal lines of the temperature field. It is mandatory that the surface is curved in order to fabricate high-quality SiC single crystals with this method. However, the curved thermal fields are also responsible for thermally induced mechanical tensions that are frozen inside the crystal after cooling down. High bow and warp values of the wafers fabricated from the boule may be the result.

When optimizing the sawing process, substrates with a satisfactory geometry, i. e. with low bow and warp values, can be cut from the monocrystals. However, the sawing process introduces a surface and subsurface damage layer into the substrate surface, which distorts the substrate and has to be removed in the subsequent polishing processes in order to achieve the desired surface quality. After the sawing process the shape of the substrate is mainly determined by mechanical stress within the near-surface damage layer. By removing this damage layer in performing said polishing processes, the thermally induced tensions that are frozen inside the crystal become the dominant effect and determine the geometry of the finished substrates. Consequently, the geometry of the substrates is changed during the polishing process, and the thermally induced stress finally determines the geometry of the fully machined wafers.

Conventional substrates often maintain the thermally induced stress and thus exhibit elevated values for bow and warp which results in a reduced yield of the overall process chain.

Furthermore, it is known to employ rather high substrate thickness, for instance a ratio between the substrate thickness and the substrate diameter of about 0.013. In U.S. Pat. No. 7,422,634 B2 it is mentioned that low bow and warp values can be achieved when choosing a substrate thickness of about 1 mm for substrates with a diameter of around 75 mm. The resulting ratio is, however, much higher than the ratio for substrates according to the current production standard. Current substrates have a diameter of about 150 mm and a thickness of 350 μm, which results in a ratio of 0.0023. Obviously, the enhanced thickness renders the substrate more stable by increasing its stiffness. Consequently, the substrate is less susceptible to a distortion due to inner mechanical tensions. However, this solution involves a higher amount of material and therefore significantly higher costs.

Published U.S. Pat. No. 8,449,671 B2 discloses a method of fabricating SiC substrates with low warp and bow, wherein the geometry of the SiC substrates is improved by means of a temperature treatment of the SiC single crystals. The thermal post-treatment of the single crystals reduces thermally induced growth tensions and improves bow and warp values of the wafers fabricated from these crystals. However, by thermally treating the crystals, also the balance of defects is changed inside the single crystals. By subjecting same to a thermal treatment, mechanical tensions are reduced by formation or relocation of line defects. The newly formed or relocated defects, however, may also negatively influence the electric characteristics of the electronic components fabricated on such substrates.

Consequently, there is still a need for an improved silicon carbide substrate and a fabrication method that ensures improved geometric characteristics of the substrate even for low thickness/diameter ratios.

This object is solved by the subject matter of the independent claims. Advantageous embodiments of the present invention are the subject matter of the dependent claims.

As already mentioned above, the geometry of fully processed SiC substrates mainly depends on tensions within the crystal lattice because all other process induced inferences, such as damage layers and mechanical influences, can be removed by using suitable sawing and polishing steps. Furthermore, processing the SiC substrates is significantly simplified if the geometry of the substrate remains unchanged during the individual processing steps, such as removal of a damage layer, because less material needs to be removed which reduces the loss of the material, and the time for processing and simplifies handling of the substrates.

Tensions in the crystal lattice are already generated by the thermal conditions during the growing of crystals. In order to avoid crystal defects during the growth of the boule, the temperature field has to be chosen in a way that the isotherms are curved at the growth front (convex crystal). Consequently, for a chosen crystal length different temperatures are present in the center compared to the peripheral regions. This leads to thermal tensions that are frozen when the crystal cools down after the growing process. If the curvature of the isotherms is chosen to be too small in order to reduce mechanical tensions, the crystals have too many defects.

Furthermore, tensions within the crystal lattice may also be caused by the presence of impurities, such as dopants or contaminants, which may comprise any chemical elements except silicon or carbon. Generally, it cannot be avoided that impurities are incorporated. On the one hand, nitrogen is usually needed as a dopant in order to adjust the electrical resistance of the substrate. On the other hand, source materials and crucible parts are always contaminated with traces of impurities, for instance iron, aluminum, or the like.

As this is known in the art, impurity atoms can replace silicon or carbon atoms at regular lattice sites, or they can be located at interstitial sites. According to the position of the impurity, the lattice constant is changed and the crystal lattice can be distorted and mechanically biased.

Furthermore, the impurity atoms may be electrically active or inactive, according to their type and position within the crystal lattice. It has to be noted that measured electric characteristics, such as the electrical resistance, of the final product do not necessarily mirror the actual impurity atom concentration.

The present invention is based on the idea that by defining in a radial direction at least two different regions in the SiC substrate and by providing significantly different concentrations of a chosen impurity atom in the first region compared to the second region, the mechanical tensions in the substrate across its overall surface can be selectively controlled. In particular, a silicon carbide substrate according to the present invention comprises an inner region which constitutes at least 30% of a total surface area of said substrate, and a ring shaped peripheral region radially surrounding the inner region. A mean concentration of a dopant in the inner region differs by at least $1 \cdot 10^{18}$ $cm^{-3}$ from the mean concentration of this dopant in the peripheral region.

Thereby, tensile annular stress, which would cause a compression of the inner region, is avoided within the peripheral region. An undesirable bow of the wafer is therefore prevented. The inventors have recognized that in the peripheral region in tangential direction a compressive stress has to be reached which in turn causes a tensile stress that acts in radial direction on the inner region. Thereby, even a deflection that would be caused by growing convex crystals can be reduced or completely avoided.

Preferably, the inner region forms 45%±15% of the total surface area of said substrate. It could be shown that this apportionment leads to the most satisfactory results. As already mentioned, the concentration in the inner region is at least different by $1 \cdot 10^{18}$ $cm^{-3}$ than in the peripheral region. Preferably, the concentration difference amounts to about $5 \cdot 10^{18}$ $cm^{-3}$ or more.

According to the present invention, any impurity element can be used as mechanically active dopant according to the present invention. Obviously to those skilled in the art the sign of the dopant concentration difference between the inner and outer region has to be selected considering the dopant element. Advantageously, nitrogen may be used which is introduced into the fabrication process anyway for determining the electrical resistance of the SiC substrate. For example, for nitrogen a higher concentration in the center area in contrast to the peripheral area has to be chosen.

Advantageously, essentially monocrystalline SiC substrates can be generated which have a bow of less than 25 μm, and a warp of less than 40 μm. In the following, the term "bow" signifies the deviation of the center point of the median surface of a free, undamped wafer from a median surface reference plane established by three points equally spaced on a circle with diameter a specified amount less than the nominal diameter of the wafer. The term "warp" signifies the difference between the most positive and most negative distances of the median surface of a free, undamped wafer from a reference plane. Warp can be zero, even for a wafer with curvature, if the curves are mirror images of each other.

The present invention may advantageously be employed for substrates that have a polytype selected from a group comprising 4H, 6H, 15R, and 3C. In particular, a 4H polytype is preferred. SiC exists in many different polytypes, such as 4H, 6H, 3C and 15R, but 4H-SiC is the polytype of highest interest for high power and high temperature electronics. The difference between different polytypes lies in the stacking sequence of Si—C bilayers along the c-axis.

Furthermore, the orientation of the substrate's surface may be 0° to 8° off-axis, preferably the substrate surface has a 4° off-orientation, instead of being nominally on-axis. This orientation has an impact on the epitaxial growth of subsequently deposited layers.

As already mentioned above, the substrate according to the present invention may be configured to comply with current standard SiC wafer dimensions and therefore epitaxial processes. In particular, the substrate has a thickness of less than 1000 μm, and more than 200 μm preferably equal to 350 μm±25 μm. Further, the substrate has a diameter of at least 100 mm, preferably 150 mm or 200 mm.

Advantageously, the substrate has an electrical resistivity in a range from 12 mΩ cm to 26 mΩ cm, preferably in the range of 18 mΩ cm to 22 mΩ cm and/or an etch pit density of less than 50 000 $cm^{-2}$. The etch pitch density (EPD) is a measure for the amount of defects and dislocations contained in the near-surface region of the substrate.

The present invention further relates to a method of growing at least one SiC single crystal boule in a physical vapor transport growth system, the method comprising the steps of: arranging an SiC powder source material in a source material compartment, arranging at least one SiC seed crystal within a growth compartment, wherein said source material compartment is connected to said growth compartment for providing sublimated gaseous components to the growth compartment, applying an elevated temperature for generating the sublimated gaseous components that generate an SiC growth phase at the SiC seed crystal, so that an SiC volume single crystal boule is formed at the SiC seed crystal, wherein the growth compartment comprises a dopant source and/or a dopant sink for controlling a dopant concentration in a radial direction with reference to a longitudinal axis of the single crystal boule during the growth of the single crystal boule.

There are several possibilities to control the dopant concentration. In the case of nitrogen as dopant, a radially peripheral region of the single crystal (with respect to the longitudinal axis) has to be provided with a lower dopant concentration than a central region. In any case, the concentration difference should amount to at least $1 \cdot 10^{18}$ $cm^{-3}$, preferably $5 \cdot 10^{18}$ $cm^{-3}$. The growth temperature may amount to around 2200° C. while reaching a pressure in a range between 0.1 mbar and 100 mbar.

This concentration difference can be achieved either by arranging a source for the particular dopant element, e.g. nitrogen, in the centre of the growth compartment, so that e. g. the inner region receives a higher amount of dopant compared to the peripheral region. Alternatively, also a getter material for the selected dopant, e.g. nitrogen, can be arranged in an outer region of the growth compartment so that it has most impact on the peripheral region of the growing crystal.

For instance, the dopant may comprise nitrogen. In this case, the central region of the growing boule can be flushed with nitrogen gas or nitrogen containing gases (e.g. ammonia). In particular, a gas inlet may be arranged centrally inside the growth compartment, injecting nitrogen gas into the atmosphere inside the growth compartment. This solution has the advantage that the concentration of the dopant built in during the growth process can quite easily be modified and optimized.

The enhanced concentration of the dopant in a central region of the growing crystal can also be achieved by providing a dopant enriched SiC powder source material in a region opposite to the seed crystal, instead of filling in a homogenous SiC powder source material. This variant has the advantage that a dopant enriched powder may be handled much easier than additional gas inlets and fluidic process agents. In particular, the SiC powder source material comprises a dopant enriched material in a region opposite to a central region of the seed crystal with a concentration of the doping element in the dopant enriched SiC powder of at least $1 \cdot 10^{20}$ $cm^{-3}$, preferably $5 \cdot 10^{20}$ $cm^{-3}$. The concentration of the doping element in the lower doped outer source material is lower than $5 \cdot 10^{17}$ $cm^{-3}$, preferably lower than $1 \cdot 10^{17}$ $cm^{-3}$.

As already mentioned, one way of providing the required concentration difference is to supply an increased amount of dopant in the first region. The other way is to locally reduce the amount of dopant supplied to the second region. This can for instance be done by providing a getter material closer to the peripheral region of the growing crystal than to the centre. The required getter material of course depends on the specific dopant of which the concentration profile has to be shaped.

According to an advantageous embodiment of the present invention, a nitrogen getter is provided as a massive lining of the crucible in the growth compartment. In the area where the crystal is growing within the crucible a massive wall lining is provided. This wall lining comprises one or more nitrogen binding metals. Such metals may for instance be tantalum, tungsten, molybdenum, niobium or hafnium. In particular, the growth compartment may be delimited by a cylindrical crucible wall, wherein an inner surface of the crucible wall comprises a tantalum, tungsten, molybdenum, niobium, and/or hafnium getter layer. According to the present invention, nitrogen that is present in the peripheral area of the growth region is partly bound to the metal and irreversible nitride bonds are produced. This means that the lateral nitrogen distribution adjacent to the growth front of the crystal is controlled in a way that in the peripheral region less nitrogen is available for being incorporated into the growing crystal than in the central region. The getter layer may be formed by a massive metallization layer that has an inner radius 2 mm larger, preferably of 1 mm larger, than the seed diameter, a thickness in a range from 0.5 mm to 3 mm, and a minimum length larger than the length of the finally grown crystal.

It is clear for a person skilled in the art, that also other getter materials can be used, depending on the particular dopant that has to be influenced in the spatial concentration of its inclusion into the single crystal.

Instead of a massive metal layer, the getter material may also be provided in the form of granular or powdery particles held in place by a porous wall, such as graphite. According to this embodiment, the method of growing at least one SiC single crystal further comprises the step of providing a porous wall distanced apart from a crucible wall inside the growth compartment, and filling a clearance between the porous wall and the crucible wall with a granular or powdery getter metal. The getter particles may comprise tantalum, tungsten, molybdenum, niobium, hafnium, or alloys or mixtures therefrom in case that nitrogen is to be gettered. Nitrogen enters the clearance via the porous graphite wall and is bound to the getter metal irreversibly. Hence, in a radial direction a nitrogen concentration profile is generated that has higher concentration values in the centre than in the peripheral region. Consequently, in a lateral region of the growing SiC single crystal there is less gaseous nitrogen available for being built into the growing crystal lattice. In particular, the getter layer is formed by metal particles as alloy or mixture of tantalum, tungsten, niobium, molybdenum and/or hafnium held in place by a porous graphite cover wall with a bulk density of 1.0 $g \cdot cm^{-3}$ to 2.0 $g \cdot cm^{-3}$, preferably of 1.2 $g \cdot cm^{-3}$, and a metal particles composition in the range of 0.01 mm to 1 mm, preferably in the range of 0.05 mm to 0.5 mm.

According to a further advantageous embodiment of the present invention, the concentration profile of the dopant in the growth compartment may be adjusted at the interface between the growth compartment and the source material compartment. In particular, the step of arranging the SiC powder source material in the source material compartment may comprise filling in a dopant (e. g. nitrogen) enriched SiC powder source material and covering an interface between the source material compartment and the growth compartment partly with a dopant (e. g. nitrogen) filter.

For instance, the dopant filter may comprise a metal such as tantalum, tungsten, niobium, molybdenum, or hafnium as alloy or mixture embodied in a graphite capsule, having a bulk density of 1.0 $g \cdot cm^{-3}$ to 2.0 $g \cdot cm^{-3}$, preferably of 1.2 $g \cdot cm^{-3}$, with a composition of dopant particle size in the range of 0.01 mm to 1 mm, preferably in the range of 0.05 mm to 0.5 mm.

Of course, also various combinations of the above embodiments are intended to be covered by the present invention.

As this is generally known in the art, PVT growth techniques suffer from the fact that the growth rate is rather slow with typically being in the range of some 100 μm/h. Thus, there is an additional need for a process to grow SiC crystals more rapidly with unimpaired characteristics. For solving this problem, the ideas according to the present invention may be applied to a symmetric PVT growth system for simultaneously growing more than one SiC single crystal boule by partitioning the inner chamber of the crucible into a central source material compartment and two symmetrically arranged growth compartments, each comprising at least one SiC seed crystal. The growth compartments are each separated from the source material compartment by a gas permeable porous barrier. By means of such a perfectly symmetric arrangement, a temperature profile can be generated which has the highest temperature in the center of the source material compartment and regions having an identical lower temperature at the site of the seed crystals. Such a PVT growth system is described in European patent EP 2 664 695 B1.

Such a method of growing two SiC single crystals simultaneously has the advantage that a much higher volume of production can be reached while still maintaining an unimpaired quality of the produced boules.

The accompanying drawings are incorporated into and form a part of the specification to illustrate several embodiments of the present invention. These drawings together with the description serve to explain the principles of the invention. The drawings are merely for the purpose of illustrating the preferred and alternative examples of how the invention can be made and used and are not to be construed as limiting the invention to only the illustrated and described embodiments. Furthermore, several aspects of the embodiments may form—individually or in different combinations—solutions according to the present invention. Further features and advantages will become apparent from the following more particular description of the various embodiments of the invention, as illustrated in the accompanying drawings, in which like references refer to like elements, and wherein:

Figure 1:
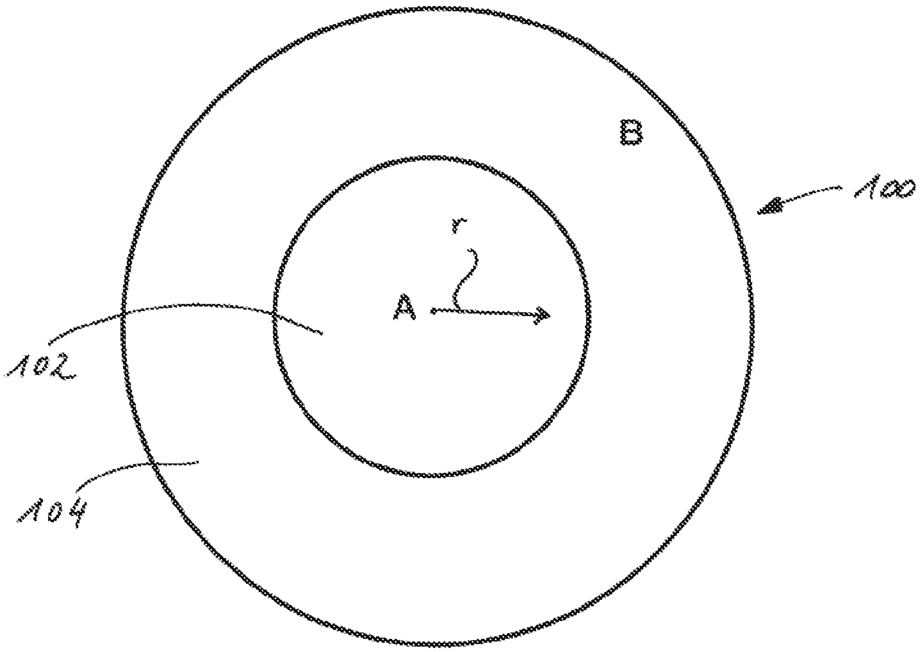
FIG. 1 shows a schematic top view of a silicon carbide substrate according to a first advantageous embodiment of the present invention.

The present invention will now be described in more detail with reference to the Figures. Turning first to FIG. 1, a schematic representation of a SiC substrate 100 (also sometimes called "wafer" in the following) according to the present invention is shown. According to the present invention, the SiC substrate 100 comprises in a radial direction (as indicated by the arrow r) a first region 102 and a second region 104. The first region 102 is surrounded by the second ring shaped region 104. As indicated by the letter "A", the first region 102 has a first mean concentration of a dopant such as nitrogen, whereas the second region 104 has a second mean concentration ("B") which is different from the first mean concentration. According to an exemplary embodiment of the present invention, the mean concentration of the dopant differs between the first region 102 and the second region 104 by at least $1 \cdot 10^{18}$ $cm^{-3}$, preferably by $5 \cdot 10^{18}$ $cm^{-3}$. In particular, the mean concentration of nitrogen in the first region 102 may be higher than the nitrogen concentration in the second peripheral region 104.

According to the present invention, the circular inner region 102 takes up at least 45%±15% of the total wafer surface. Accordingly, the ring shaped outer region 104 of course also takes up at least 45%±15% of the total wafer surface. As a result, it can be avoided that a tensile ring shaped stress is generated in the peripheral region 104. Rather, in the peripheral region 104, a compressive stress prevails which results in a tensile, radially acting stress in the first region 102. This tensile stress in the first region 102 counteracts a preset deflection due to the growth of convex crystals (or at least reduces this effect).

By introducing impurity atoms with different mean concentrations in the different first and second regions, mechanical stress can selectively be generated inside the silicon carbide substrate in a way that the thermal tension which is generated during the growth procedure is compensated. As a result, the SiC substrate 100 according to the present invention is low strain or ideally strainless after removal of all near surface disturbing layers by applying the final polishing steps. Consequently, the SiC substrate 100 does not have stress induced geometric errors and therefore has low bow and warp values. This advantageous geometry allows for an excellent thermal coupling of such substrates in an epitaxial reactor, the thermal coupling being decisive for homogeneous high-quality epitaxial layer growth. Furthermore, high-quality electronic components can be fabricated on a substrate according to the present invention. Moreover, also the material loss can be reduced during machining because due to the compensation of stress no distortion is occurring and therefore the material removal is decreased significantly. As already mentioned above, known thick substrates exhibit even with the thermal or mechanical stress low bow and warp values. However, the SiC substrates according to the present invention may have much lower thicknesses and still exhibit excellent geometric characteristics. For instance, ratios of the thickness and the diameter in a range between 0.002 and 0.004 can be achieved.

The SiC substrate 100 according to the present invention may be distinguished by the following features when providing a nitrogen dopant concentration which is about $5 \cdot 10^{18}$ $cm^{-3}$ higher in the first (inner) region 102 than in the second (outer) region 104: The dimensions may be chosen so that the diameter is 100 mm or even 150 mm or even 200 mm with a wafer thickness of less than 1000 μm and more than 200 μm, for example 350 μm±25 μm. The overall dislocation density as indicated by the etch pit density (EPD) may amount to 50 000 $cm^{-2}$, preferably stay below 10 000 $cm^{-2}$. The electrical resistivity may be in a range between 12 mΩ cm and 26 mΩ cm, preferably between 18 mΩ cm and 22 mΩ cm.

It could be shown that these SiC substrates have a bow of less than 25 μm, even below 15 μm, and a warp of less than 40 μm, even below 30 μm.

Depending on the intended subsequent epitaxial layers and on the required optical and semiconductor material properties, the SiC substrate may have one of the more than 200 possible SiC polytypes that have been found up to date. As this known in the art, the most common polytypes include 3C, 2H, 4H, 6H, 8H, 9R, 10H, 14H, 15R, 19R, 20H, 21 H, and 24R, where (C), (H) and (R) are the three basic cubic, hexagonal and rhombohedral crystallographic categories. In the cubic zinc-blende structure, labelled as 3C-SiC or β-SiC, Si and C occupy ordered sites in a diamond framework. In hexagonal polytypes nH-SiC and rhombohedral polytypes nR-SiC, generally referred to as α-SiC, nSi—C bilayers consisting of C and Si layers stack in the primitive unit cell. Preferably, the substrate according to the present invention is of the 4H polytype. Moreover, the orientation of the substrate is between 0° and 8°, preferably 4° off-axis. Polytype and orientation is usually controlled by the orientation of the seed crystal or by tilting during the crystal preparation.

Figure 2:
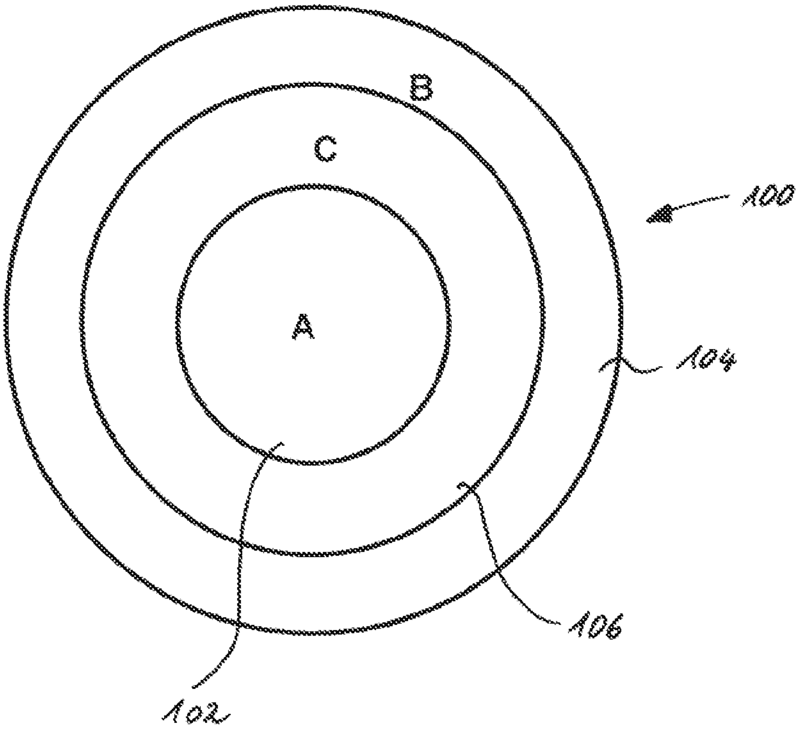
FIG. 2 shows a schematic top view of a silicon carbide substrate according to a second advantageous embodiment of the present invention.

FIG. 2 shows a further aspect of the substrate according to the present invention. When fabricating the SiC substrate in a PVT system, it can be expected that there will be no sharp delimiting line between the regions 102 and 104. Rather, there is a transitional region 106 having a gradient of the mean dopant concentration that lies between the values A and B of regions 102 and 104, respectively. The dopant concentration in the transitional region 106 is marked with the letter "C". It has to be understood, that in the transitional region 106 the dopant concentration is variable along the radial direction r to lead from the higher value A in the central region 102 to the lower value B in the peripheral region 104.

Importantly, it has to be noted that FIGS. 1 and 2 are schematic representations and are not to scale regarding the dimensions of regions 102, 104, and 106, and regarding the area ratios of these regions with respect to each other.

FIGS. 3 to 9 illustrate different embodiments of PVT processes for growing single crystal boules which can be sliced into substrates as described with reference to FIGS. 1 and 2.

Physical vapor transport (PVT), also known as seeded sublimation growth, has been the most popular and successful method to grow large sized SiC single crystals. U.S. Pat. No. 8,747,982 B2 describes an advantageous fabrication method that can be used and modified to fabricate SiC substrates according to the present invention.

A first example of generating a dopant profile in a radial direction during growth of an SiC single crystal 108 will be explained with reference to FIG. 3. In the following, the growing SiC single crystal 108 will also be referred to as "boule".

Figure 3:
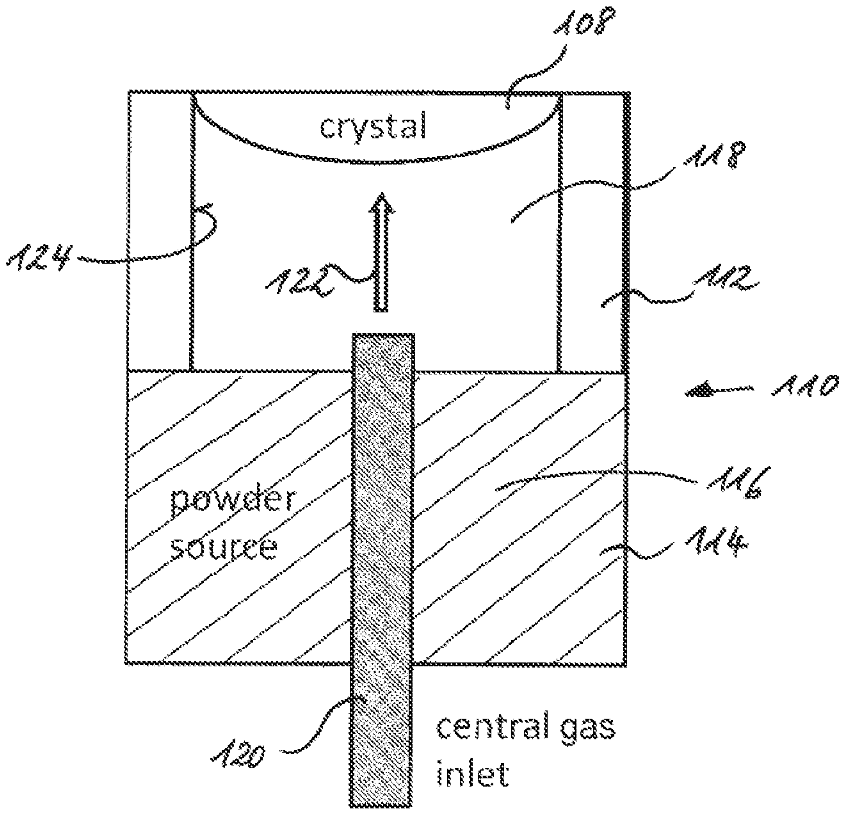
FIG. 3 shows a schematic cross sectional view of a PVT growth apparatus according to a first embodiment of the present invention.

FIG. 3 shows a schematic view of a PVT growth cell 110, wherein PVT growth of a SiC single crystal 108 is carried out in a graphite crucible 112 sealed with a graphite lid and loaded with a sublimation source 114 disposed in a source material compartment 116 at the bottom of the crucible 112. A single crystal seed (not visible in the Figures) is arranged at the crucible top. A thermal insulation material surrounds the crucible 112 and is only open in the region of a heat dissipation channel which generates the temperature gradient which is necessary for recondensation (not shown in the Figures).

The sublimation source 114 is usually a polycrystalline SiC grain or powder synthesized in a separate process. The loaded crucible 112 is placed inside a growth chamber where it is surrounded by the thermal insulation (not shown in the Figures). Inductive or resistive heating (not shown in the Figures) is used to bring the crucible 112 to a suitable temperature, generally between 2000° C. and 2400° C. for the PVT growth of a SiC single crystal on the SiC single crystal seed. The growth chamber may for instance be made of fused silica, and an RF coil is positioned with respect to the crucible 112 such that during growth of the single crystal the temperature of the sublimation source 114 is maintained higher than the temperature of the seed crystal (typically with a difference of 10 to 200K).

Upon reaching a suitably high temperature, the sublimation source 114 vaporizes and fills a growth compartment 118 of the crucible 112 with a vapor of silicon, $Si_2C$ and $SiC_2$ molecules. The temperature difference between the sublimation source 114 and the seed crystal forces the vapor to migrate and to condense on the seed crystal, thereby forming a growing single crystal boule 108. In order to control the growth rate, PVT growth is typically carried out in the presence of a small pressure of inert gas, usually between 0.1 mbar and 100 mbar.

In addition to known arrangements as the ones shown in U.S. Pat. No. 8,747,982 B2, the present invention provides a gas inlet 120 which is arranged centrally within the growth compartment 118 in order to provide a directed gas stream 122 that is directed towards a central region of the growing crystal 108. Thereby, a dopant concentration difference occurs between those regions of the growth compartment 118 which are close to an inner wall 124 of the crucible 112 and the central region. By providing a higher dopant concentration close to the center of the growing crystal 108, a higher dopant concentration is built into the growing crystal lattice in the center compared to the concentration that is built in in the peripheral regions. Depending on the particular parameters of the gas stream 122, a concentration profile as shown in FIG. 1 or 2 can be realized for the finally processed SiC substrates that are produced from the crystal 108.

In the shown embodiment, the gas stream 122 contains nitrogen as a dopant. However, of course, also other suitable gases, e.g. ammonia, can be introduced into the growth compartment 118 via the inlet 120.

Figure 4:
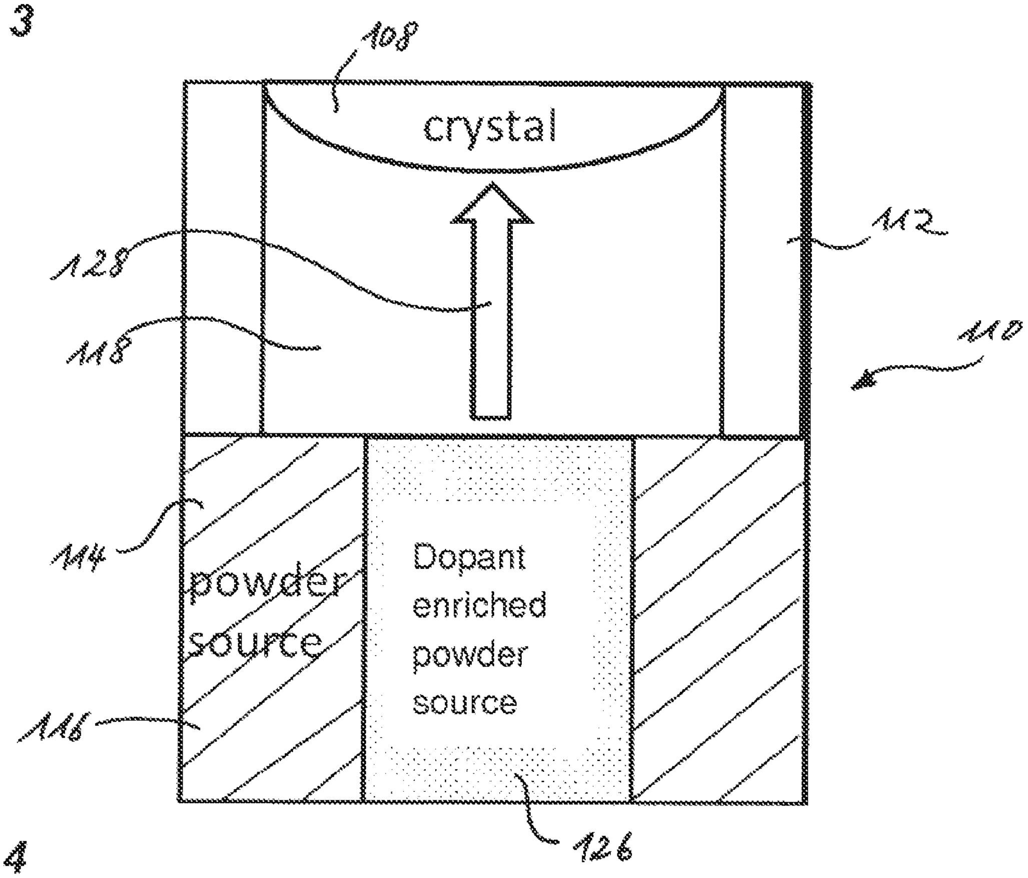
FIG. 4 shows a schematic cross sectional view of a PVT growth apparatus according to a further embodiment of the present invention.

FIG. 4 shows a second advantageous embodiment of a growth cell 110 according to the present invention. Again, the crystal 108 grows from a seed crystal arranged in a growth compartment 118. A sublimation powder source 114 is contained in a source material compartment 116. The bulk density of the source material should be in the range of 1.0 $g\cdot cm^{-3}$ to 2.6 $g\cdot cm^{-3}$, preferably in the range of 1.4 $g\cdot cm^{-3}$ to 1.8 $g\cdot cm^{-3}$. The grain size (D50) of the source material should be in the range of 100 μm to 1000 μm, preferably in the range of 300 μm to 500 μm. In contrast to known arrangements, however, the powder source 114 is not homogeneously distributed across the whole diameter of the crucible 112. According to the present invention, the center of the source material compartment 116 comprises an enriched source material 126 that is additionally enriched with a dopant. The concentration of the doping element in the enriched SiC powder is at least $1\cdot 10^{20}$ $cm^{-3}$, preferably $5\cdot 10^{20}$ $cm^{-3}$. The concentration of the doping element in the lower doped outer source material is lower than $5\cdot 10^{17}$ $cm^{-3}$, preferably lower than $1\cdot 10^{17}$ $cm^{-3}$. During the heating process, a stream 128 of the dopant is generated when vaporizing the enriched source material 126. Additionally, also a gradual dilution of the dopant can be provided at the interface between the undoped source material and the enriched source material 126.

The advantage of this embodiment compared to the embodiment shown in FIG. 3 can be seen in the fact that firstly no gaseous dopant sources have to be handled and that, secondly, during the growth process no continuous access to the crucible 112 is required.

Figure 5:
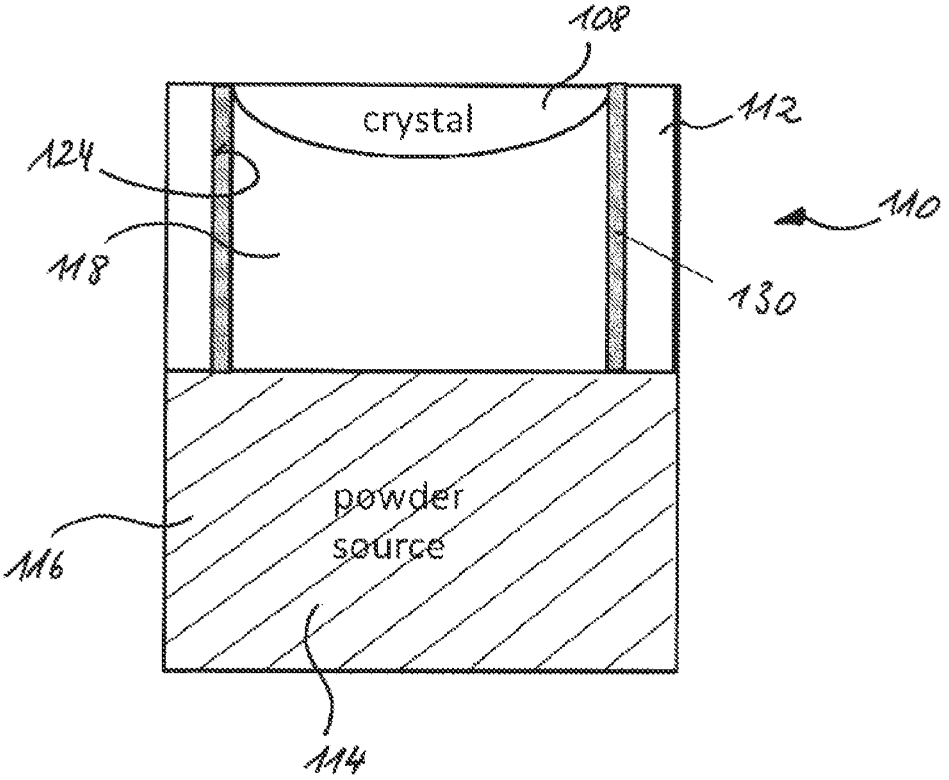
FIG. 5 shows a schematic cross sectional view of a PVT growth apparatus according to a further embodiment of the present invention.
Figure 6:
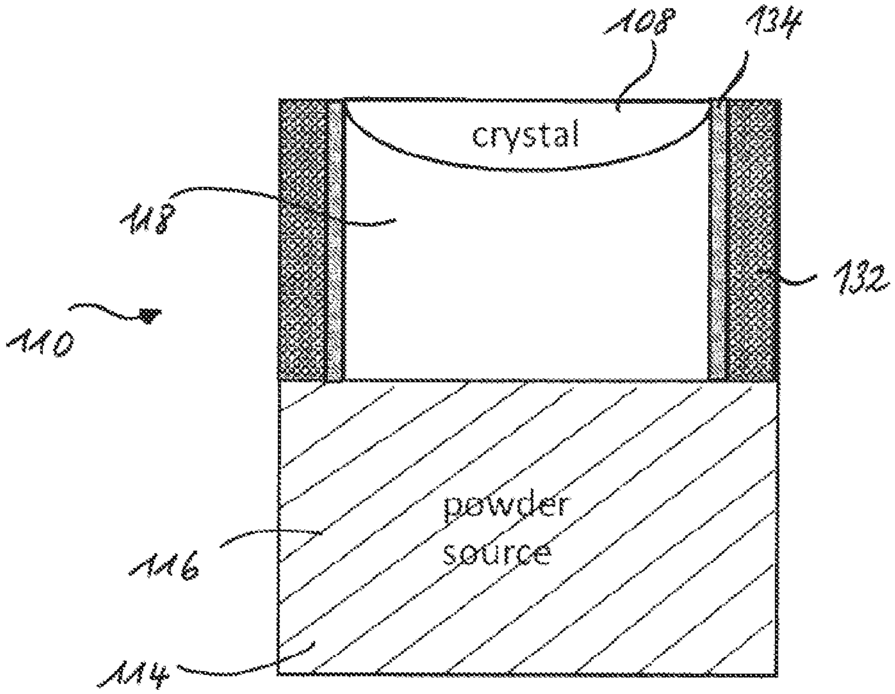
FIG. 6 shows a schematic cross sectional view of a PVT growth apparatus according to a further embodiment of the present invention.

FIGS. 3 and 4 relate to the idea to actively enhance the concentration of a dopant, such as nitrogen, in the center of the growth compartment 118. FIGS. 5 and 6, on the other hand, describe embodiments where the concentration of the dopant is actively decreased in the peripheral regions of the growth compartment 118.

As shown in FIG. 5, the growth cell 110 comprises a growth compartment 118 and a source material compartment 116. The source material compartment 116 is filled with a sublimation source material 114 as this is known for conventional growth cells. According to the present invention, the inner wall 124 of the crucible 112 is at least partly covered with a solid getter material 130. The getter material 130 selectively attracts and binds dopant atoms that are present in the growth compartment 118, thereby reducing their concentration in a region close to the wall 124 of the crucible 112. Consequently, the dopant concentration in the central region of the growth compartment 118 is higher than the concentration in the peripheral regions and the growing crystal 108 comprises a central region with a higher dopant concentration compared to the peripheral regions. Due to the reduced availability of the dopant in the peripheral region of the growth compartment 118, a lower dopant concentration is incorporated into the growing crystal 108 at the outer region compared to the central region.

For instance, when using nitrogen as a dopant, the solid getter material 130 may comprise a metal such as tantalum, tungsten, niobium, molybdenum or hafnium or alloys thereof. These elements bind nitrogen irreversibly by forming nitride bonds. Other suitable getter materials may of course also be used. The design of the getter is such that it is in cylindrical shape with a diameter slightly larger than the seed diameter, with a radial gap of 2 mm, preferably with a gap of 1 mm, to be close enough for effective gettering, with a thickness in the range of 0.5 mm to 3 mm, and a minimum length larger than the crystal length maintaining absorption of nitrogen at the crystal rim during the complete crystal growth process.

FIG. 6 shows a further advantageous example of a growth cell 110 according to the present invention. This arrangement is similar to the one shown in FIG. 5 in that a getter material is provided in the periphery delimiting the growth compartment 118. Instead of a solid getter layer, however, granular or powdery getter particles 132 are provided according to this embodiment. In order to keep these getter particles 132 in place, a porous cover wall 134 is provided at the inside of the growth compartment 118. The porous cover wall 134 may for instance be formed from graphite that allows a diffusion of the molecules and atoms from the growth compartment to the getter material and vice versa. Therefore, the cover wall may have a bulk density of 1.0 $g\cdot cm^{-3}$ to 2.0 $g\cdot cm^{-3}$, preferably of 1.2 $g\cdot cm^{-3}$.

According to the present invention, the getter particles 132 may comprise one or more nitrogen binding metals such as tantalum, tungsten, niobium, molybdenum or hafnium as alloy or mixture, in a granulated or powdered form. Nitrogen which is present as a dopant in the growth compartment 118 diffuses through the porous graphite wall 134 and irreversibly forms nitride bonds with the getter particles 132. Thereby the lateral nitrogen distribution close to the growth front of the crystal 108 is influenced in a way that less nitrogen is available for being built into the crystal at the margin than within the center of the crystal 108. To balance the getter functionality over the whole time of the crystal growth process, the composition of grain and powder sizes has to be adjusted in the range of 0.01 mm to 1 mm, preferably in the range of 0.05 mm to 0.5 mm, in order to offer an optimized free surface of the getter.

A concentration profile according to the present invention as shown in FIGS. 1 and 2 can be achieved thereby.

Figure 7:
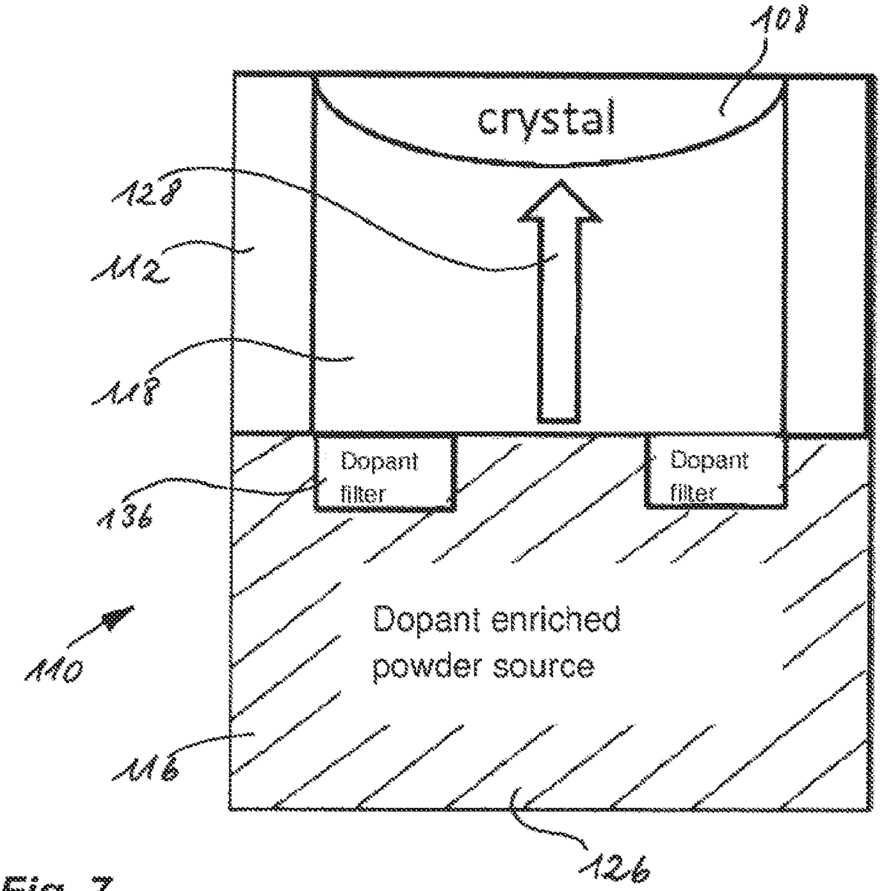
FIG. 7 shows a schematic cross sectional view of a PVT growth apparatus according to a further embodiment of the present invention.

FIG. 7 shows a further advantageous example of a growth cell 110 according to the present invention. According to this particular embodiment, the source material compartment 116 is completely filled with a dopant enriched powder source material 126. For controlling a stream 128 of dopant, e. g. a stream of nitrogen, which is directed towards the center of the crystal 108, a filter element 136 is arranged at the interface between the source material compartment 116 and the growth compartment 118. The filter element 136 is arranged to cover a peripheral region of this interface and to leave open a central region in order to allow dopant, such as nitrogen, to pass towards the crystal 108 when the powder source material 126 is evaporated.

As shown in FIG. 7, the dopant filter 136 may for instance have a ring-shaped form in order to provide a more or less ring-shaped area of the growth compartment 118 which has a reduced dopant concentration compared to the central area as indicated by the dopant stream 128. The filter may comprise a metal such as tantalum, tungsten, niobium, molybdenum, or hafnium as alloy or mixture, in either a granulated or powdered form embodied in a graphite capsule that allows a diffusion of the molecules and atoms from the powder compartment to the growth compartment via the filter. The filter has a bulk density of 1.0 $g\cdot cm^{-3}$ to 2.0 $g\cdot cm^{-3}$, preferably of 1.2 $g\cdot cm^{-3}$ To balance the getter functionality over the whole time of the crystal growth process, the composition of grain and powder sizes has to be adjusted in the range of 0.01 mm to 1 mm, preferably in the range of 0.05 mm to 0.5 mm, in order to offer an optimized free surface of the getter. The height of the filter capsule has to be adjusted such that the getter capability is maintained throughout the crystal growth process, having a thickness in the range of 1 mm to 20 mm, preferably in the range of 5 mm to 10 mm.

Of course, the ideas according to the embodiments shown in FIGS. 3 to 7 may also be combined with each other in any arbitrary way that might be necessary for producing a desired dopant concentration profile in the silicon carbide substrates.

As already mentioned above, the production times for growing SiC single crystals may be significantly reduced by simultaneously growing two crystals instead of one. In order to achieve such a simultaneous growth, the principles of European patent EP 2 664 695 B1 may be adapted to the ideas according to the present invention.

Figure 8:
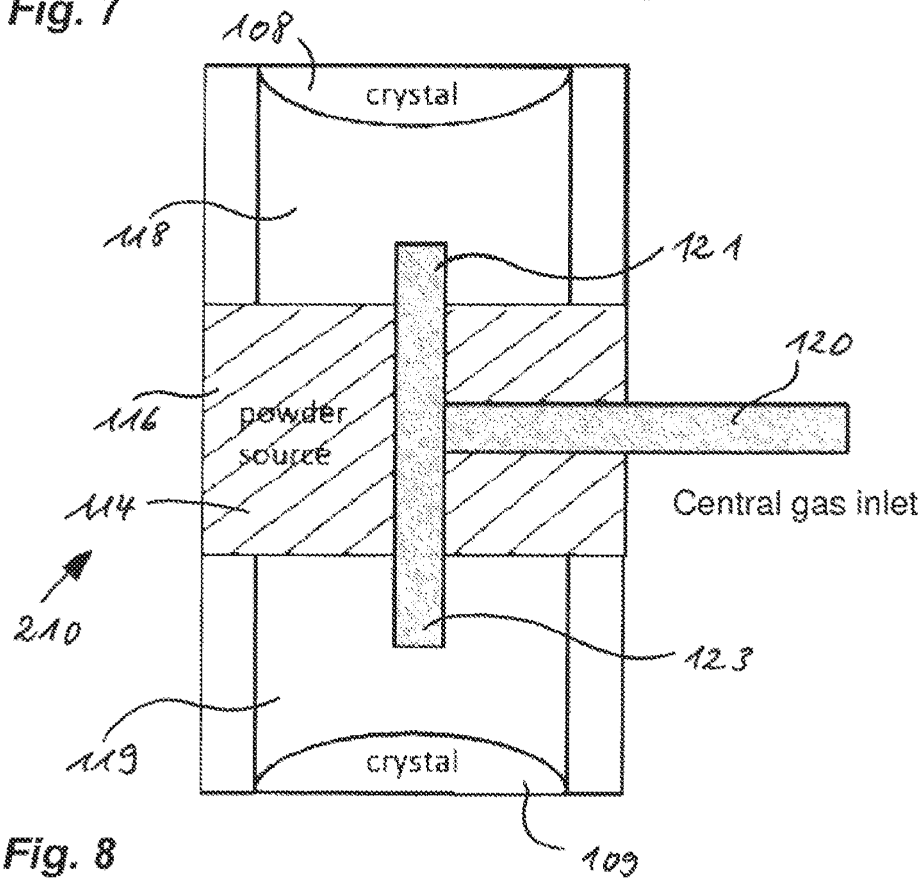
FIG. 8 shows a schematic cross sectional view of a PVT growth apparatus according to a further embodiment of the present invention.

As shown in FIG. 8, a growth cell 210 according to the present invention may comprise two growth compartments 118, 119. The growth compartments 118, 119 are arranged symmetrically with respect to a source material compartment 116 that comprises a sublimation source 114. In each of the growth compartments 118, 119 one crystal 108, 109 is growing from a seed crystal (not shown in the Figures). Similar to the arrangement shown in FIG. 3, a gas inlet 120 is provided for introducing nitrogen gas towards each of the growing crystals 108, 109. Of course, any other gaseous dopant, e.g. ammonia may also be covered by this embodiment.

In each of the growth compartments 118, 119 a dopant inlet 121, 123 is arranged in a way that the respective central region of the growth compartments 118, 119 are supplied with a higher concentration of dopant than the peripheral regions.

Figure 9:
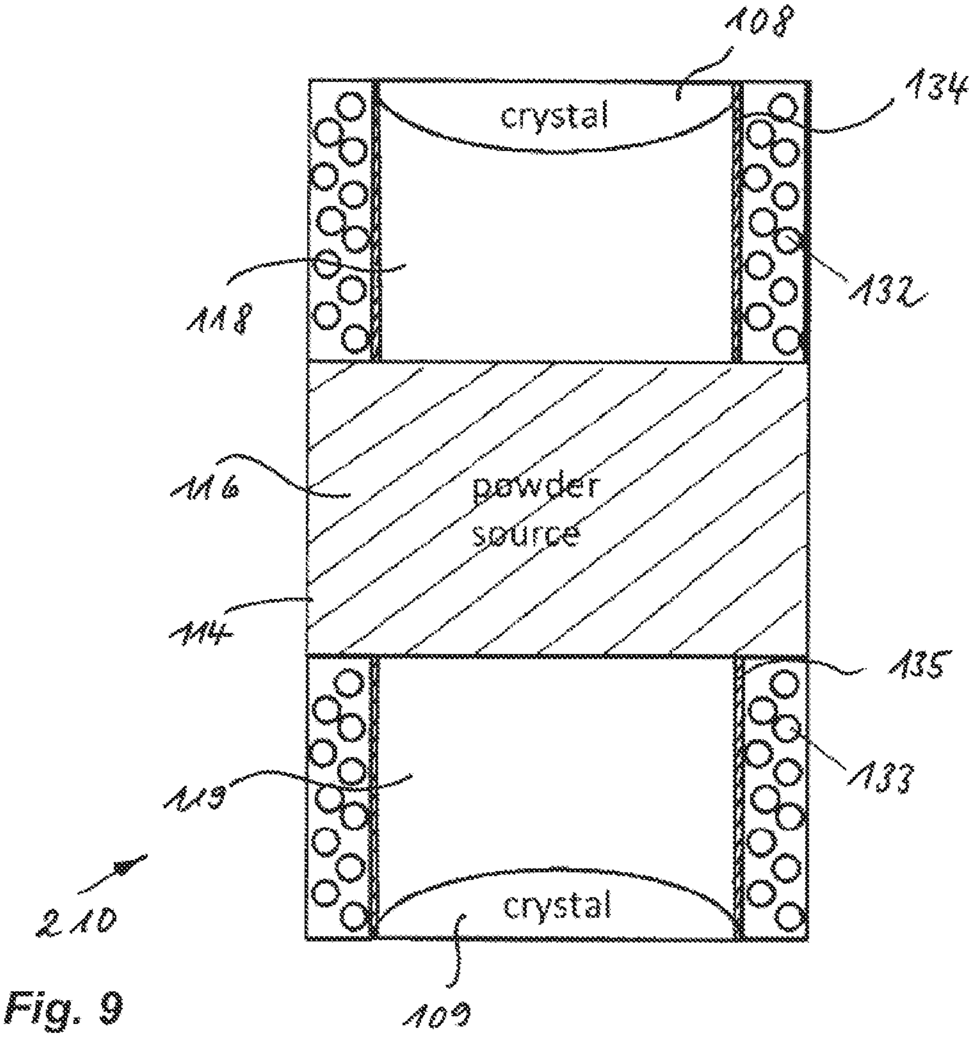
FIG. 9 shows a schematic cross sectional view of a PVT growth apparatus according to a further embodiment of the present invention.

In an analogous way as explained with reference to FIGS. 5 and 6, the growth cell 210 may also make use of the idea of reducing the dopant concentration in the peripheral regions by providing a granulated or powdered getter material, e.g. metals such as tantalum, tungsten, niobium, molybdenum or hafnium as alloy or mixture. FIG. 9 shows an example where getter particles 132, 133 are arranged behind porous cover walls 134, 135 that allow a diffusion of the molecules and atoms from the growth compartment to the getter material and vice versa. Therefore, the cover wall shows a bulk density of 1.0 $g \cdot cm^{-3}$ to 2.0 $g \cdot cm^{-3}$, preferably of 1.2 $g \cdot cm^{-3}$. To balance the getter functionality over the whole time of the crystal growth process the composition of grain and powder sizes has to be adjusted in the range of 0.01 mm to 1 mm, preferably in the range of 0.05 mm to 0.5 mm, in order to offer an optimized free surface of the getter.

By binding a certain amount of the dopant atoms from the peripheral regions of the growth compartments 118, 119, the getter particles 132, 133 generate a concentration gradient of the dopant inside the growth compartments 118, 119. In particular, the dopant concentration, e.g. nitrogen, in the center of the growth compartments 118, 119 is higher than in the peripheral region in order to lead to a higher dopant concentration being built into the growing crystals 108, 109 in their central regions.

Instead of providing getter particles 134, 133, also a solid getter material as shown in FIG. 5 may be provided. As explained for the previous embodiments, the chosen getter material depends on the dopant of which the concentration profile has to be shaped. For nitrogen for instance tantalum, tungsten, hafnium, niobium, molybdenum, or hafnium as alloy or a mixture thereof can be used. The design of the solid getter is such that it is in cylindrical shape with a diameter slightly larger than the seed diameter, with a radial gap of 2 mm, preferably with a gap of 1 mm, in order to be close enough for effective gettering, with a thickness in the range of 0.5 mm to 3 mm and a minimum length larger than the crystal length maintaining absorption of nitrogen at the crystal rim during the complete crystal growth process.

According to the present invention, the mean concentration of a dopant in the inner region 102 differs by an absolute value of at least $1 \cdot 10^{18}$ $cm^{-3}$ from the mean concentration of this dopant in the peripheral region 104. When assuming for instance that the mean concentration in the inner region 102 is in a range between $3 \cdot 10^{18}$ $cm^{-3}$ and $3 \cdot 10^{19}$ $cm^{-3}$ and that the mean concentration of the dopant in the peripheral region 104 is lower than in the inner region 102, this would mean that the absolute difference of at least $1 \cdot 10^{18}$ $cm^{-3}$ would correspond to relative differences between 3% and 50% in relation to the mean concentration of the dopant in the peripheral region 104. This relationship can be derived from the following calculation.

For a mean concentration of the dopant in the inner region of $3 \cdot 10^{19}$ $cm^{-3}$, the mean concentration in the peripheral region is calculated as $3 \cdot 10^{19}\ cm^{-3} - 1 \cdot 10^{18}\ cm^{-3} = 2.9\ \ 10^{19}\ cm^{-3}$, so that the value of $1 \cdot 10^{18}$ $cm^{-3}$ corresponds to 3%.

On the other hand, for a mean concentration of the dopant in the inner region of $3 \cdot 10^{18}$ $cm^{-3}$, the mean concentration in the peripheral region is calculated as $3 \cdot 10^{18}\ cm^{-3} - 1 \cdot 10^{18}\ cm^{-3} = 2 \cdot 10^{18}\ cm^{-3}$, so that the absolute value of $1 \cdot 10^{18}$ $cm^{-3}$ corresponds to 50%.

Reference Numerals:

| Reference Numeral | Description |
|---|---|
| 100 | SiC substrate |
| 102 | Inner region |
| 104 | Outer region |
| 106 | Transitional region |
| 108, 109 | SiC single crystal boule |
| 110, 210 | Growth cell |
| 112 | Crucible |
| 114 | Sublimation source material |
| 116 | Source material compartment |
| 118, 119 | Growth compartment |
| 120, 121, 123 | Gas inlet |
| 122 | Gas stream |
| 124 | Inner wall of crucible |
| 126 | Dopant enriched source material |
| 128 | Stream of dopant |
| 130 | Solid getter material |
| 132, 133 | Getter particles |
| 134, 135 | Porous cover wall |
| 136 | Dopant filter |

What is claimed is:

1. Method of growing at least one SiC single crystal boule (108, 109) in a physical vapor transport growth system, the method comprising the steps of:

arranging an SiC powder source material (114) in a source material compartment (116), arranging at least one SiC seed crystal within at least one growth compartment (118, 119), wherein said source material compartment (116) is connected to said at least one growth compartment (118, 119) for providing sublimated gaseous components to the at least one growth compartment (118, 119), and applying an elevated temperature for generating the sublimated gaseous components that generate an SiC growth phase at the SiC seed crystal, so that an SiC volume single crystal boule (108, 109) is formed at the SiC seed crystal, wherein the at least one growth compartment (118, 119) comprises a dopant source and/or a dopant sink for controlling a dopant concentration in a radial direction with reference to a longitudinal axis of the single crystal boule (108, 109) during the growth of the single crystal boule (108, 109) such that a dopant concentration in a central region of the single crystal boule (108, 109) differs from a dopant concentration in a peripheral region of the single crystal boule (108, 109), and wherein the SiC powder source material comprises a dopant enriched material (126) in a region opposite to a central region of the seed crystal with a concentration of a doping element in the dopant enriched material (126) of at least $1 \cdot 10^{20}$ $cm^{-3}$ and wherein a concentration of the doping element in a lower doped outer SiC powder source material is lower than $5 \cdot 10^{17}$ $cm^{-3}$.

2. Method according to claim 1, wherein said dopant comprises nitrogen, and wherein the nitrogen dopant concentration is higher in an inner region (102) than in the peripheral region (104).

3. Method according to claim 2, wherein a central region of the growing boule (108, 109) is flushed with nitrogen and/or ammonia gas.

4. Method according to claim 1, wherein the at least one growth compartment is delimited by a cylindrical crucible wall and wherein an inner surface (124) of the crucible wall comprises a tantalum, tungsten, niobium, molybdenum and/or hafnium getter layer.

5. Method according to claim 4, wherein said getter layer is formed by a massive metallization layer (130) which has an inner radius which is 2 mm larger than a seed diameter, a thickness in a range from 0.5 mm to 3 mm, and a minimum length that is larger than the length of the finally grown crystal.

6. Method according to claim 4, wherein said getter layer is formed by metal particles (132, 133) as alloy or mixture of tantalum, tungsten, niobium, molybdenum and/or hafnium held in place by a porous graphite cover wall (134, 135) with a bulk density of 1.0 $g \cdot cm^{-3}$ to 2.0 $g \cdot cm^{-3}$, and a metal particles composition in the range of 0.01 mm to 1 mm.

7. Method according to claim 1, wherein the step of arranging the SiC powder source material in the source material compartment comprises filling in a dopant enriched SiC powder source material (126) and covering an interface between the source material compartment (116) and the at least one growth compartment (118, 119) partly with a dopant filter (136).

8. Method according to claim 1, wherein at least one SiC seed crystal is arranged within each of two growth compartments, wherein said source material compartment is arranged symmetrically between the two growth compartments and is separated from each of the growth compartments by a gas permeable porous membrane.

9. Method of growing at least one SiC single crystal boule (108, 109) in a physical vapor transport growth system, the method comprising the steps of:

arranging an SiC powder source material (114) in a source material compartment (116), arranging at least one SiC seed crystal within at least one growth compartment (118, 119), wherein said source material compartment (116) is connected to said at least one growth compartment (118, 119) for providing sublimated gaseous components to the at least one growth compartment (118, 119), and applying an elevated temperature for generating the sublimated gaseous components that generate an SiC growth phase at the SiC seed crystal, so that an SiC volume single crystal boule (108, 109) is formed at the SiC seed crystal, wherein the at least one growth compartment (118, 119) comprises a dopant source and/or a dopant sink for controlling a dopant concentration in a radial direction with reference to a longitudinal axis of the single crystal boule (108, 109) during the growth of the single crystal boule (108, 109) such that a dopant concentration in a central region of the single crystal boule (108, 109) differs from a dopant concentration in a peripheral region of the single crystal boule (108, 109), and wherein the at least one growth compartment is delimited by a cylindrical crucible wall and wherein an inner surface (124) of the crucible wall comprises a tantalum, tungsten, niobium, molybdenum and/or hafnium getter layer.

10. Method according to claim 9, wherein said dopant comprises nitrogen, and wherein the nitrogen dopant concentration is higher in an inner region (102) than in the peripheral region (104).

11. Method according to claim 10, wherein a central region of the growing boule (108, 109) is flushed with nitrogen and/or ammonia gas.

12. Method according to claim 9, wherein said getter layer is formed by a massive metallization layer (130) which has an inner radius which is 2 mm larger than a seed diameter, a thickness in a range from 0.5 mm to 3 mm, and a minimum length that is larger than the length of the finally grown crystal.

13. Method according to claim 9, wherein said getter layer is formed by metal particles (132, 133) as alloy or mixture of tantalum, tungsten, niobium, molybdenum and/or hafnium held in place by a porous graphite cover wall (134, 135) with a bulk density of 1.0 $g \cdot cm^{-3}$ to 2.0 $g \cdot cm^{-3}$, and a metal particles composition in the range of 0.01 mm to 1 mm.

14. Method according to claim 9, wherein the step of arranging the SiC powder source material in the source material compartment comprises filling in a dopant enriched SiC powder source material (126) and covering an interface between the source material compartment (116) and the at least one growth compartment (118, 119) partly with a dopant filter (136).

15. Method according to claim 9, wherein at least one SiC seed crystal is arranged within each of two growth compartments, wherein said source material compartment is arranged symmetrically between the two growth compartments and is separated from each of the growth compartments by a gas permeable porous membrane.

* * * * *